(12) United States Patent
Karpov et al.

(10) Patent No.: US 9,577,190 B2
(45) Date of Patent: Feb. 21, 2017

(54) THERMAL MANAGEMENT STRUCTURE FOR LOW-POWER NONVOLATILE FILAMENTARY SWITCH

(71) Applicant: Intel Corporation, Santa Clara, CA (US)

(72) Inventors: Elijah V. Karpov, Santa Clara, CA (US); Prashant Majhi, Austin, TX (US); Niloy Mukherjee, Beaverton, OR (US); Ravi Pillarisetty, Portland, OR (US); Uday Shah, Portland, OR (US); Brian S. Doyle, Portland, OR (US); Robert S. Chau, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/752,935

(22) Filed: Jun. 27, 2015

(65) Prior Publication Data

US 2016/0380194 A1 Dec. 29, 2016

(51) Int. Cl.
*H01L 27/24* (2006.01)
*H01L 45/00* (2006.01)
*G11C 13/00* (2006.01)

(52) U.S. Cl.
CPC ....... *H01L 45/1293* (2013.01); *G11C 13/0002* (2013.01); *H01L 27/2418* (2013.01); *H01L 27/2463* (2013.01); *H01L 45/1253* (2013.01); *H01L 45/141* (2013.01)

(58) Field of Classification Search
CPC ............. H01L 27/2418; H01L 27/2481; H01L 27/2463; H01L 45/16; H01L 45/1293; H01L 45/141; H01L 45/1266; H01L 12/1253; G11C 13/0002; G11C 13/0007; G11C 13/0004
USPC .................................................... 257/2, 656
See application file for complete search history.

(56) References Cited

U.S. PATENT DOCUMENTS

| | | | |
|---|---|---|---|
| 2012/0280196 A1* | 11/2012 | Yang | H01L 45/1608 257/1 |
| 2015/0263069 A1* | 9/2015 | Jo | H01L 45/00 365/148 |
| 2016/0049447 A1* | 2/2016 | Jung | H01L 27/2463 257/4 |

* cited by examiner

*Primary Examiner* — Thomas L Dickey
*Assistant Examiner* — Changhyun Yi
(74) *Attorney, Agent, or Firm* — The Law Office of Herbert T. Patty

(57) ABSTRACT

Heat-trapping bulk layers or thermal-boundary film stacks are formed between a heat-assisted active layer and an associated electrode to confine such transient heat to the active layer in a heat-assisted device (e.g., certain types of resistance-switching and selector elements used in non-volatile memory. Preferably, the heat-trapping layers or thermal-boundary stacks are electrically conductive while being thermally insulating or reflective. Heat-trapping layers use bulk absorption and re-radiation to trap heat. Materials may include, without limitation, chalcogenides with Group 6 elements. Thermal-boundary stacks use reflection from interfaces to trap heat and may include film layers as thin as 1-5 monolayers. Effectiveness of a thermal-boundary stack depends on the thermal impedance mismatch between layers of the stack, rendering thermally insulating bulk materials optional for thermal-boundary stack components.

43 Claims, 12 Drawing Sheets

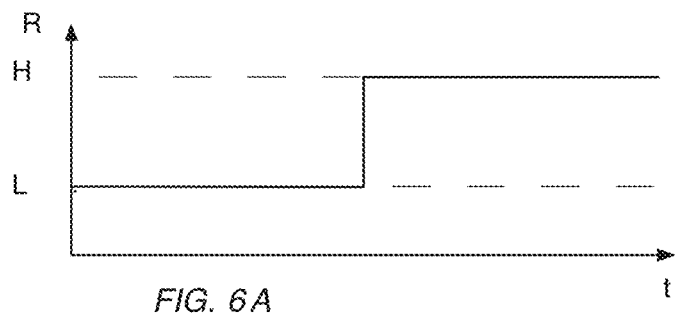
FIG. 6A
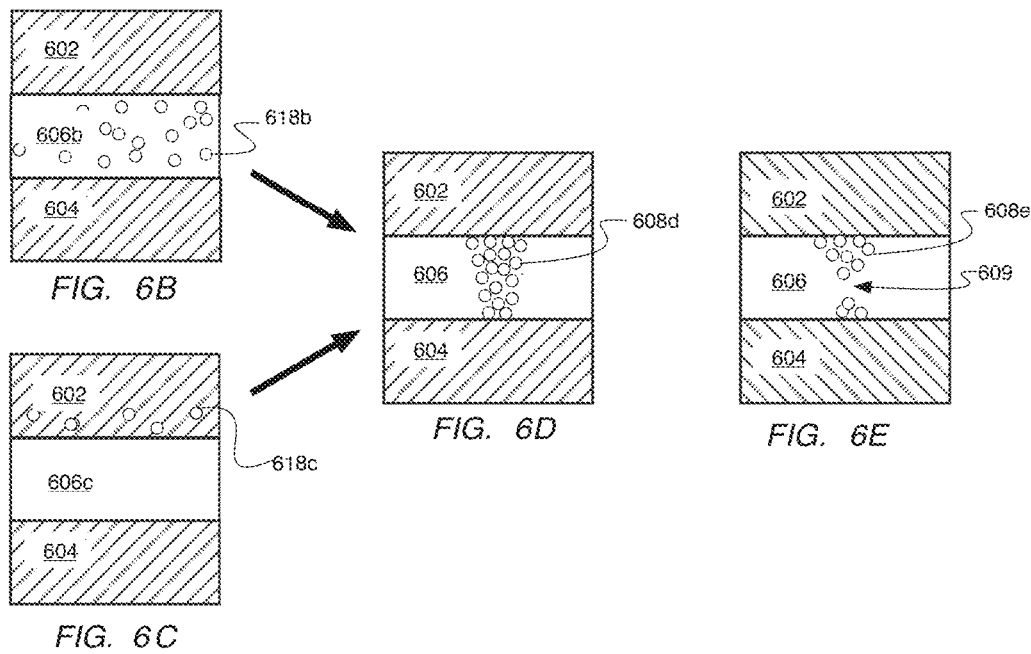
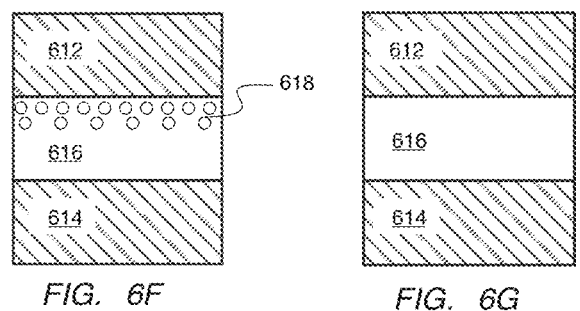

THERMAL MANAGEMENT STRUCTURE FOR LOW-POWER NONVOLATILE FILAMENTARY SWITCH

FIELD

Embodiments described herein generally relate to thin-film-based switches that operate by repeatedly changing resistance between at least two values, and more particularly the use of heat to assist at least one of the resistance changes.

BACKGROUND

Heat-trapping layers with high electrical conductivity and low thermal conductivity confine heat inside switchable layers of heat-assisted resistance-switching (RS) cells, such as nonvolatile memory cells, so that switching processes involving Joule heating consume less electrical power. The same approach may reduce power consumption during activation of those types of selectors that require heat to activate (not all selectors use heat).

Resistance-switching NVM, also known as ReRAM or RRAM, is a possible replacement for flash memory and other charge-storage-based forms of nonvolatile memory. Resistance-switching cells repeatedly change their resistance between at least two distinguishable values in response to a signal, such as an applied electric, magnetic, thermal, chemical, optical, or combination stimulus. In the absence of the resistance-changing stimulus, and even in the absence of supplied power, the cell retains its last programmed resistance, making it usable as a static, or nonvolatile, memory element.

In the simplest case, the cell switches between two resistance values, a low-resistance state (LRS) and a high-resistance state (HRS). Such a cell can store one bit of data by assigning one state to "logic-zero" and the other to "logic-one." The cell is written (its resistance is changed) by the application of a write signal (e.g., voltage, current, heat, light, etc.) that is at or above a write-threshold strength. The cell is read (its resistance is sensed without being changed) by applying a voltage (or current) that is below the write-threshold strength, measuring the output current (or voltage), and applying Ohm's law (R=V/I, where R is resistance, V is voltage, and I is current.

Cells that can be repeatedly switched between more than two resistance states have been demonstrated. Such cells may store multiple bits of data.

Although NVM is a leading application of resistance-switching cells, the cells may also be used for other switching applications; for example, as a threshold switch or a logic element that keeps its state when the device is powered down and powered back up.

Some non-limiting examples of resistance-switching modalities include redistribution of conductive metal atoms in an otherwise insulating medium, redox reactions that change the ionic content of the medium, varying the material phase or degree of crystallinity, or varying the ferromagnetic properties. Many types of resistance-switching designs and mechanisms have their own names and acronyms, and some writers treat particular schemata as different from what they term "ReRAM" or "RRAM." For purposes herein, "resistance-switching," "resistance-switchable," and "RS" are interchangeable and refer to any repeatable or reversible resistance changes (i.e., they exclude irreversible changes such as the electrical breakdown that occurs in a fuse or anti-fuse). "RS-NVM" means non-volatile memory based on repeatedly or reversibly induced resistance changes in selected individual memory elements or cells.

Reliable and responsive materials are critical to RS-NVM performance. However, sometimes there are trade-offs between responsivity and reliability because sensitive materials may be sensitive to other stimuli besides the switching signal. Thermal issues are often a cause for concern, more so as memory-cell density increases and memory arrays are placed closer to processor logic arrays. Yet some types of switching make use of heat. Heat may be the dominant switching stimulus in some phase-change and thermochemical switching. In addition, some types of electrical switching in redox, valency-change, crystallinity-change, and metal-migration cells may be assisted by localized heat; that is, switching at a higher temperature consumes less electrical power or has some other advantage.

Therefore, a need exists for controlling thermal conditions in RS-NVM cells and their near neighboring components such as diodes, transistors, other switches, and other cells in the RS-NVM array. Heating is preferably sufficient where it is necessary or beneficial to the intended function, yet preferably it is not so excessive or uncontrolled that performance of other components, or of the device as a whole, is compromised. Operating at lower power reduces the amount of heat dissipated.

BRIEF DESCRIPTION OF DRAWINGS

FIGS. 6A-G conceptually illustrate some examples of resistance switching phenomena.

DETAILED DESCRIPTION

Definitions

The following terms have the following meanings in this document:

"1T1R": One transistor, one resistor
"Amorphous": Crystallinity less than 30&
"Crystalline": Crystallinity greater than 30%
"Distributed": Non-contiguous with each other but having similar structure and function "Doping": Adding another material that makes up less than about 20% of the finished composition.

"Electrically conductive": Resistivity less than 1 Ω*cm

"Electrically insulating": Resistivity greater than 1e4 Ω*cm

"Embedded": Formed on the same chip as at least one module that performs a different function.

"eNVM": embedded non-volatile memory

"Filament": A conductive path through an insulating material

"I-V": current vs. voltage

"Layer": One or more film layers

"Nonvolatile": Retains an operational state through power-off and power-on, e.g., a nonvolatile resistance switching cell may maintain its resistance within 10% when its surrounding structure is powered up or down.

"NVM": non-volatile memory

"RAM": Random-Access Memory

"SoC": System-on-chip

"Stack": Two or more film layers

"Switching": Controlled, repeatable changing of a transmission-related characteristic between at least two states "Thermally conductive": Thermal conductivity greater than 10 W/(m ° K)

"Thermally insulating": Thermal conductivity less than 5 W/(m ° K)

Electrical Responses of RS-NVM Cell

Figure 1:
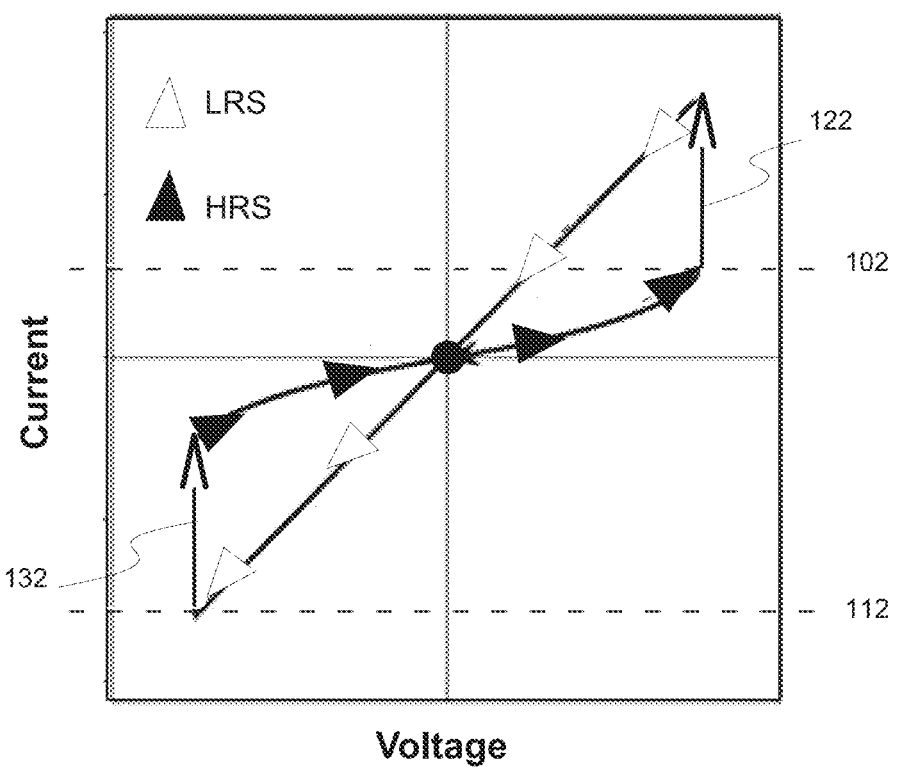
FIG. 1 is an example of an I-V curve for a generic bipolar RS-NVM cell.

FIG. 1 is an example of an I-V curve for a generic bipolar RS-NVM cell. Some valency-change, electrochemical metallizing, and electrostatic/electronic RS cells are bipolar. The curve shows hysteresis; its output voltage for a given input current depends on whether the RS is in a low-resistance state (LRS, line with white triangles) or a high-resistance state (HRS, line with black triangles). Current level 102, which triggers transition 122 from HRS to LRS, is known as the "set" current, while current level 112 triggers transition 132 from LRS to HRS and is known as the "reset" current.

In the resistive random-access memory (ReRAM) art using RS elements, this I-V curve may vary in several ways. Set current 102 and reset current 112 may differ. The relationships between the LRS and HRS curve slopes and shapes may also vary. Set and reset jumps 122 and 132 may be longer or shorter, or may not be straight lines. Some curves are not symmetrical about the origin. For clarity, only two repeatable resistance states are shown for each of the cells, but some cells may switch between three, four, or more states. However, once this simplified curve is understood, variations can be visualized. Moreover, the curve shape is not necessarily a factor in the performance of the thermal management approach of this document.

Context of Some Embodiments Including Thin-Film Resistors

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work-function metal or N-type work-function metal, depending on whether the transistor is to be a PMOS or an NMOS transistor. In some implementations, the gate electrode layer may consist of a stack of two or more metal layers, where one or more metal layers are work-function metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Schematic Variations of RS Cells

FIGS. 2A-2D are non-limiting examples of RS cell schematics. In all the figures, VDD is the supply voltage and 204, the schematic symbol for a variable resistor, is the RS element (e.g., layer or stack). The other component may function as a selector to allow (or prevent) switching of its cell, for example in a memory or logic array.

Figure 2A:
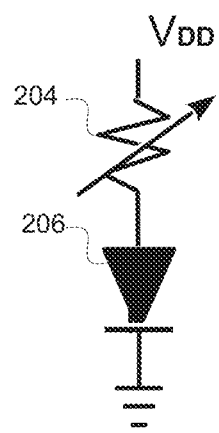
FIGS. 2A-2D are non-limiting examples of RS cell schematics.

FIG. 2A represents a one-diode, one-resistor (1D1R) cell. Diode 206 selects whether series-connected RS component 204 is written or not. For some RS cells (e.g., unipolar cells), a diode may be effective as a selector to ensure that the target cells, and only the target cells, are written.

Figure 2B:
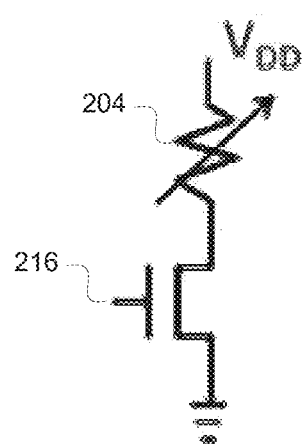

FIG. 2B represents a one transistor, one-resistor (1T1R) cell design with transistor 206 in series with RS component 204. The transistor is turned on to select the cell for switching and turned off to de-select the cell and keep it in a constant-resistance state. The transistor may be a bipolar junction transistor (BJT), a metal-oxide-semiconductor field-effect transistor (MOSFET), or any other suitable transistor type. The transistor may be an effective selector enabling fast random access and programming, but its size may limit the density of the memory array, its fabrication adds cost, and its operation may in some cases consume an undesirable amount of extra power)

Figure 2C:
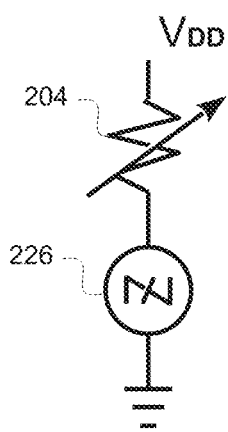

FIG. 2C represents a one-switch, one-resistor (1S1R) cell design with a two-terminal thin film selector 226 serially connected to RS element 204. Two-terminal thin film selector 226 has a low-conductance state and a high-conductance state, somewhat analogous to the HRS and LRS of RS element 204. Unlike RS element 204, two-terminal thin film selector 226 is volatile; it requires a hold current to keep it in the high-conductive state.

Figure 2D:
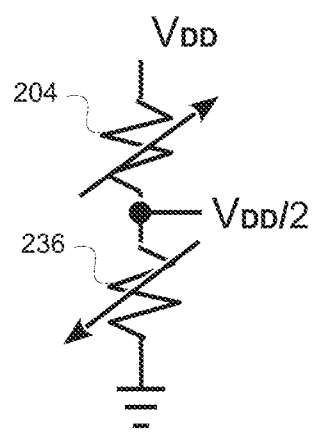

FIG. 2D shows a two-resistor (2R) cell design. The two series-connected RS elements 204 and 236 have complementary states. Initially both RS elements are set to HRS. To write to a 2R cell, one of the RS elements is selectively reset to LRS. The cells are read differentially.

RS-NVM Arrays

Figure 3:
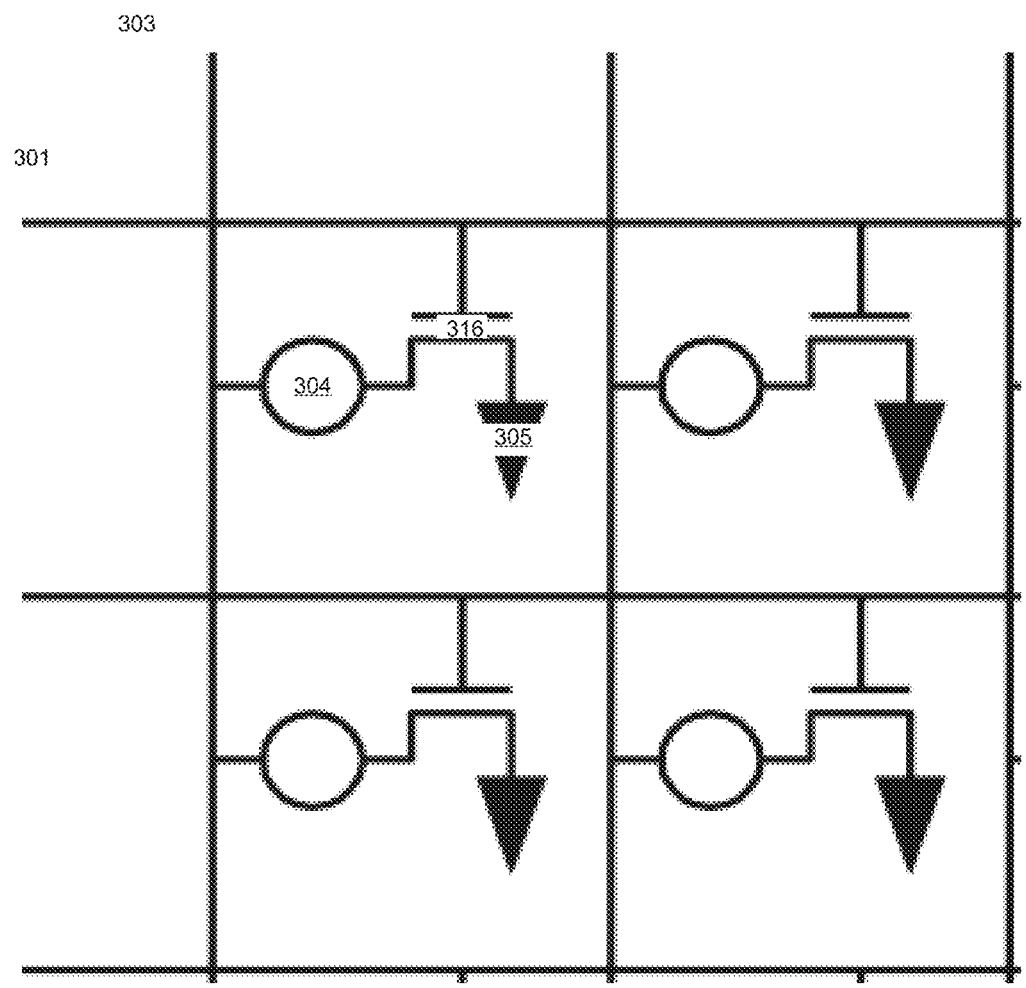
FIG. 3 is a simplified schematic of a section of a memory array using transistors as selectors.

FIG. 3 is a simplified schematic of a section of a memory array using transistors as selectors. The disclosed subject matter is not limited to this type of array, but may be used with any type of array. Each transistor 306 is connected by its gate to a wordline 301, by its source to a first terminal of RS element 304, and by its drain to circuit common (or ground) 305. A second terminal of RS element 304 is connected to a bitline 303. Although RS elements 304 may have very small footprints, transistors 306 may be significantly larger and therefore, even where RS elements 304 are fabricated on top of transistors 306, transistor size may place a practical limit on cell density.

Figure 4:
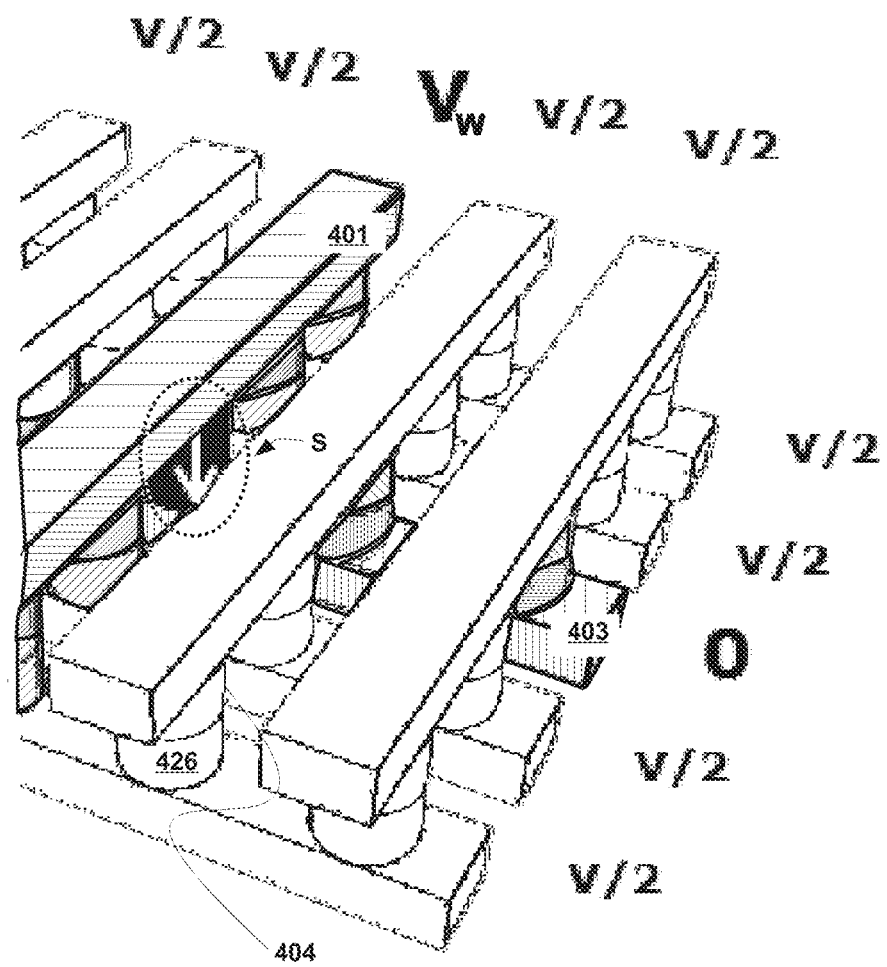
FIG. 4 is a simplified physical drawing of a resistor-less crossbar memory array

FIG. 4 is a simplified physical drawing of a resistor-less crossbar memory array. Wordlines 401 and bitlines 403 are orthogonal sets of conductive strips separated by pillars forming the cells. The insulating field fill material that may surround the cells and lines in practice is omitted from the drawing to make the active structure visible. The pillars may be made by depositing a series of "blanket" thin films and etching away the material between the pillars, or by any other suitable fabrication method. Each pillar includes RS element 404 and two-terminal selector 428, which may be an ovonic switch, a thresholding switch, or any other suitable switching structure. Other layers or structures may be formed between bitlines 403 and RS element 404 between RS element 404 and two-terminal selector 428, or between two-terminal selector 428 and bitline 403. Without the need to accommodate transistors in the cells with the substantially smaller RS elements and two-terminal selectors, this array can be fairly dense.

In the illustrated example, all the wordlines 401 and bitlines 403 are held at V/2, half the write voltage Vw. To write to selected cell S, the wordline voltage is raised to Vw and the bitline voltage is lowered to 0 so that the voltage drop across selected cell S is the full write voltage Vw.

The crossbar is not the only array configuration used for RS-NVM. Numerous other 2D and 3D arrays have been designed. For example, in columnar 3D arrays, the wordline may be a rod with the RS film stack formed concentrically around it. The bitlines may be conductive sheets or plates with holes that surround and make contact with the rod coatings, or may be films formed concentrically around the coated rods.

Separate, Embedded, and Distributed NVM

Figure 5A:
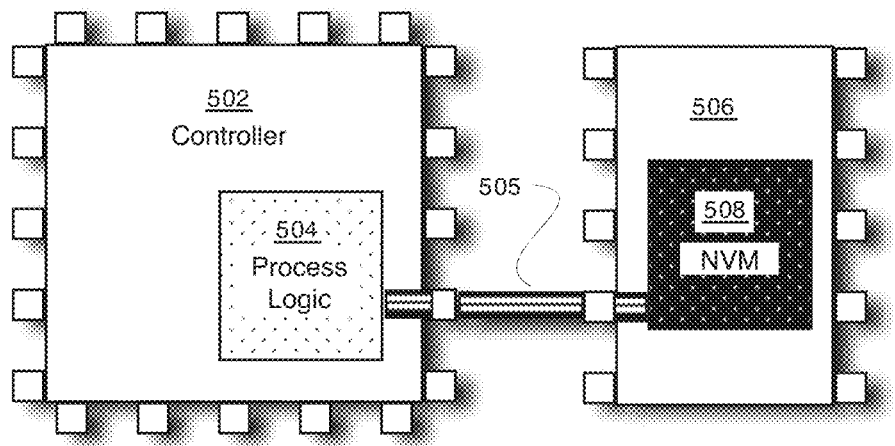
FIGS. 5A-C are block diagrams of connected, embedded, and distributed NVM.
Figure 5B:
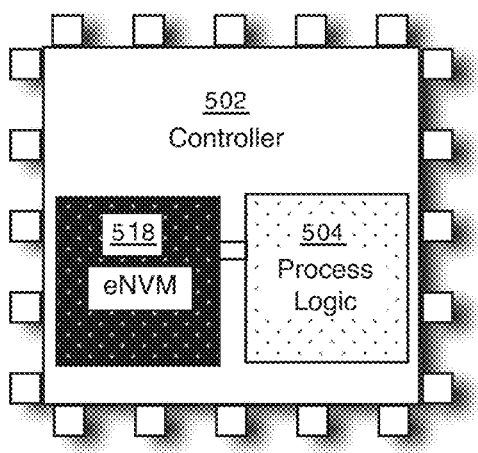
Figure 5C:
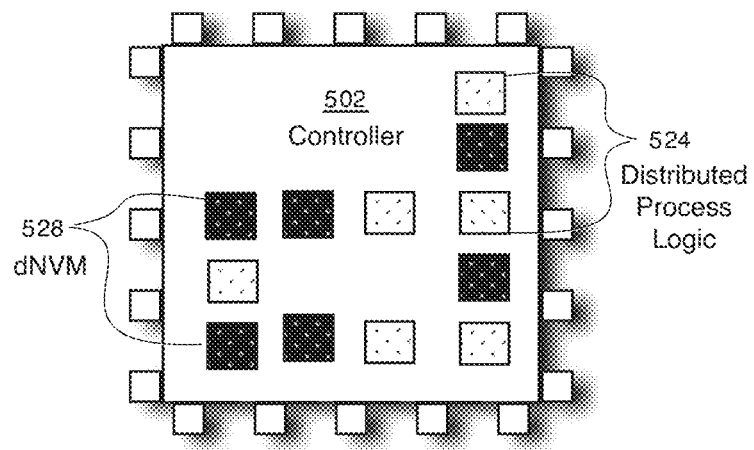

FIGS. 5A-C are block diagrams of connected, embedded, and distributed NVM.

In FIG. 5A, process logic 504 on controller chip 502 is connected by chip-to-chip bus 505 to NVM 508, which is located on a separate memory chip 506. This approach affords the flexibility to optimize the materials and processes separately for each of the chips. Heat issues in NVM 508 may be confined to memory chip 506 and are thus unlikely to affect, or be affected by, process logic 504 on controller chip 502. Conversely, any heat issues in process logic 504 or elsewhere on controller chip 502 are unlikely to affect NVM 508. Unfortunately, passing information back and forth between process logic 504 and NVM 508 is slow. Furthermore, the space taken up by the two separate chips becomes a more significant drawback in small mobile devices where space comes at an increasing premium.

In FIG. 5B, NVM 518 is on the same controller chip 502 as a process logic 504. NVM in this position is known as embedded NVM or "eNVM." Space taken up by the two functions is much less when they can be on the same chip. Also, with just a short lead carrying the signal traffic between process logic 504 and NVM 518, data transfer is significantly faster than when the signal traffic traverses inter-chip bus 505 in FIG. 5B. The trade-off is that everything on controller chip 502 needs to be compatible to avoid compromising neighboring components performance. At this proximity, the issues in eNVM 518 might affect process logic 504 and vice versa.

In FIG. 5C, the NVM and the process logic are no longer monolithic and segregated to different areas of controller chip 502. Both process logic 524 and NVM 528 are broken up into smaller modules and intermixed with each other around the area of controller chip 502. NVM in this configuration is known as distributed NVM or "dNVM." This flexible arrangement allows parts of the process logic and memory to be distributed around other components of the controller chip. It may also enable the process logic or memory involved with a particular component to be placed very close to that component for even faster signal exchange.

The closer NVM gets to the process logic, the more critical thermal management becomes, particularly for memory or logic elements with heat-assisted functions. If, for example, a read signal is an attenuated version of the write signal (such as current passing through the cell in a particular direction) and heating can boost the effective signal strength, a cell being read in the presence of excess heat from a may be inadvertently written. Presently, much mass-produced NVM must meet a standard that includes satisfactory performance at a steady-state ambient temperature of 85 C, making it highly unlikely that on-chip transient heating will cause inadvertent write events. However, there may be specialized applications or particular situations where compliance to the standard is not compulsory or guaranteed.

Resistance-Switching Thin-Film Stacks

FIGS. 6A-6G conceptually illustrate some examples of resistance switching phenomena. FIG. 6A is a reference chart representing the resistance R of an RS cell beginning in low resistance state L and being switched to high resistance state H. The cells illustrated in the column underneath the part of the graph where R=L (FIGS. 6D, 6F, and 6H) represent low-resistance states in different cell types. The cells illustrated in the column underneath the part of the graph where R=H (6E, 6G, and 6I) represent corresponding high-resistance states. Materials in switchable layers 606b and 606c may include transition metal oxides such as nickel oxide, hafnium oxide, titanium oxide, tantalum oxide, zirconium oxide, zirconium oxide, lanthanum oxide, or silicon oxide, semiconductors such as amorphous silicon, or solid electrolytes such as germanium selenide or germanium telluride.

FIG. 6D conceptually illustrates a filament-based RS cell. A string of conductors 608d (the "filament") extends through insulating RS layer 606 from top electrode 602 to bottom electrode 604. The filament of conductors 608d is a conductive path of least electrical resistance between the electrodes 602 and 604. Subsequent read currents may tend to travel through the filament of conductors 608d rather than the surrounding insulating material of layer 606, and the output voltage will therefore indicate a low-resistance state. Materials for electrodes 602 and 604 may include, without limitation, transition metal nitrides such as hafnium nitride, titanium nitride, tantalum nitride, zirconium nitride, aluminum nitride, lanthanum nitride, or silicon nitride, reactive metals such as silver or copper, or noble metals such as ruthenium, rhodium, palladium iridium, or platinum. Electrode 602 may be made of a different material than electrode 604.

In some embodiments, there may be multiple filaments. If at least one filament spans the RS layer 606 from electrode 602 to electrode 604, the cell may be in its LRS.

FIGS. 6B and 6C represent two different starting points for making a cell capable of forming a filament like the one in FIG. 6D. When the cells are first fabricated, the intended switchable layers 606b and 606c are electrically insulating, with a resistance far above the operating HRS.

In FIG. 6B, conductors 618b (atoms of conductive elements, ions, charge carriers, etc.) are spread throughout switchable layer 606b. An initial filament-forming current, generally much stronger than the set or reset current, mobilizes conductors 618b in switchable layer 606b, where they self-organize into at least one filament (see FIG. 6D).

In FIG. 6C, conductors 618c originate in top electrode 602 rather than in switchable layer 606c. For example, in some RS cells based on metal migration, electrode 602 may include the migrating metal (e.g., silver or copper). In alternative embodiments, conductors 618c may originate in the bottom electrode 604, an interface layer, or anywhere else outside layer 606c, which will become the switchable layer. The initial filament-forming current drives conductors 618c into switchable layer 606, where they subsequently self-organize into at least one filament (see FIG. 6D).

In FIG. 6E, the filament-based cell of FIG. 6D has been reset by creating at least one gap 609 separating conductors 608e. Gap 609 may be anywhere along the filament; at the top, at the bottom, or in between. In some embodiments, gap 609 coincides with a "weak spot" in the filament; the thinnest part of the filament, the part where conductors 608e were spaced farthest apart, or where a feature of the surrounding material in RS layer 606 (or in an interface between RS layer 606 and electrode 602 or electrode 604) causes local heating in or near the filament. Subsequent read currents passing through the cell may cross the high-resistance gap 609 as well as flowing through the conductors 608e that remained in place. As a result, the output voltage will indicate a high-resistance state in the FIG. 6E cell.

Applying a set current to the FIG. 6E cell re-forms conductors 608e into an intact or continuous filament, bridging gap 609. With the conductive filament restored, the cell returns to the low-resistance state pictured in FIG. 6D. Advantageously, the filament may be broken and re-formed many times without damage or loss of distinguishability between the HRS and the LRS.

Depending on the embodiment, heat may be used to help create gap 609. In some embodiments, heat may also be used to promote mobility of conductors through the material structures of the cell during filament-forming and set processes.

FIGS. 6F and 6G represent RS cells switching by uniform, reversible ion exchange across an interface. In many cells using uniform ion exchange, switching layer 616 may be a conductive metal oxide.

In FIG. 6F, a set current flowing from electrode 612 through switchable layer 616 toward electrode 614 causes an oxidation reaction at the interface between electrode 612 and switchable layer 616. The reaction produces ions 618 which raise the conductivity of the adjacent section of switchable layer 616. These ions do not form a filament as in FIG. 6D; instead, the ions are distributed in a roughly uniform manner in the region near the originating interface. Because part of switchable layer 616 has become more conductive, this state is read as the LRS.

In FIG. 6G, a reset current flowing in the opposite direction (from electrode 614 through switchable layer 616 to electrode 612) causes a reduction reaction at the interface between electrode 612 and switchable layer 616 such that interfacial ions 618 disappear. Without the ions 618, switchable layer 616 is less conductive, and this state is read as the HRS. In this type of cell, heat may be used to promote the oxidation reaction, and the reduction reaction may release heat.

Effect of Heat-Trapping Layers

Figure 7A:
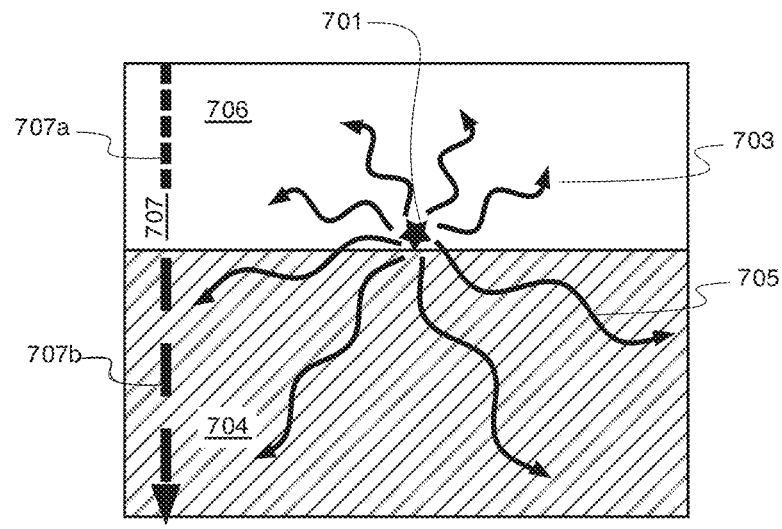
FIGS. 7A-B conceptually illustrate heat flow in a switchable layer and electrode of RS cells with and without heat management layers.
Figure 7B:
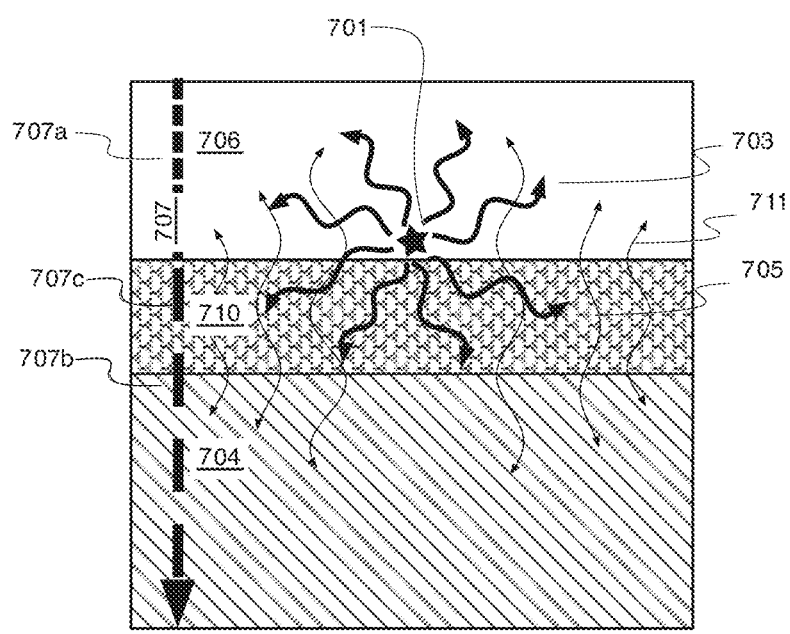

FIGS. 7A-7B conceptually illustrate heat flow in a switchable layer and electrode of RS cells with and without heat management layers. For ease of explaining these basic concepts, the "hot spot" created where the reset current flows through the thinnest part of a filament is simplified as point source, or small-volume source, of heat 701.

In FIG. 7A, the line characteristics of downward arrow 707 are intended to indicate the electrical properties of the layers. Switchable layer 706 has a higher electrical resistance than electrode 704. This distinction is symbolized by the contrast between the short, narrowly spaced dashes of line segment 707a (higher resistance) and the long, widely spaced dashes in line segment 707b (lower resistance).

In some RS cells, switching layer 706 is a thermal insulator as well as an electrical insulator, and electrode 704 is a thermal conductor as well as an electrical conductor. Moreover, in some cells electrode 704 is significantly thicker than the RS layer. Therefore, if heat were emitted in all directions by heat source 701, heat 703 emitted into RS layer 706 is temporarily retained in the thermally insulating material of that layer, but heat 705 emitted into electrode 704 is rapidly conducted away from RS layer 706. Heat 705 that leaks out through the electrode may be unavailable to promote or assist switching processes in the cell. Instead, heat 705 may be conducted to neighboring structures, potentially compromising their performance. An insulating field fill, such as a silicon oxide, often surrounds the sidewalls of cells, so the interfaces with thermally conductive electrodes seem to dominate.

In FIG. 7B, heat-trapping layer 710 is interposed between RS layer 706 and electrode 704. The material in heat-trapping layer 710 is electrically conductive, as symbolized by the long, widely spaced dashes in line segment 707c of arrow 707. The electrical conductivity prevents the new heat-trapping layer 710 from interfering with read and write currents flowing between the electrodes. However, instead of being thermally conductive like electrode 704, heat-trapping layer 710 is thermally insulating like RS layer 706. Heat 705 directed toward electrode 704, instead of leaking away, is retained, absorbed and re-emitted by heat-trapping layer 710. Some of the re-emitted heat goes back into RS layer 706, combining with heat 703 that was emitted directly into RS layer 706, and further assists the reset or set process. The heat that reaches electrode 704 is attenuated by passage through heat-trapping layer 710 and is less likely to cause problems in neighboring structures than the unattenuated heat leaking through the electrode in FIG. 7A.

Electrically conductive, thermally insulating materials include, but are not limited to, chalcogenides with elements from Groups 5 and 6 of the periodic table and their compounds. Preferably, the electrical conductivity may be high enough to add only a second-order or negligible amount to the voltage drop across the RS cell, and the thermal conductivity may be less than that of silicon oxide (1.3-1.5 W/m*K). By way of non-limiting example, the intrinsic conductivity is 0.20 W/m*K for GST-C (germanium antimony telluride GeSbTe doped with carbon), 0.33 W/m*K for GST-TiN (GeSbTe doped with titanium nitride), 0.27 W/m*K for GST-Ti (GeSbTe doped with titanium) deposited at low temperatures, and 0.69 for GST-Ti deposited at high temperatures. A 10 nm heat-trapping layer was calculated to add only about 50 mV to the voltage drop across the RS cell—a small fraction of the total voltage drop.

Figure 8:
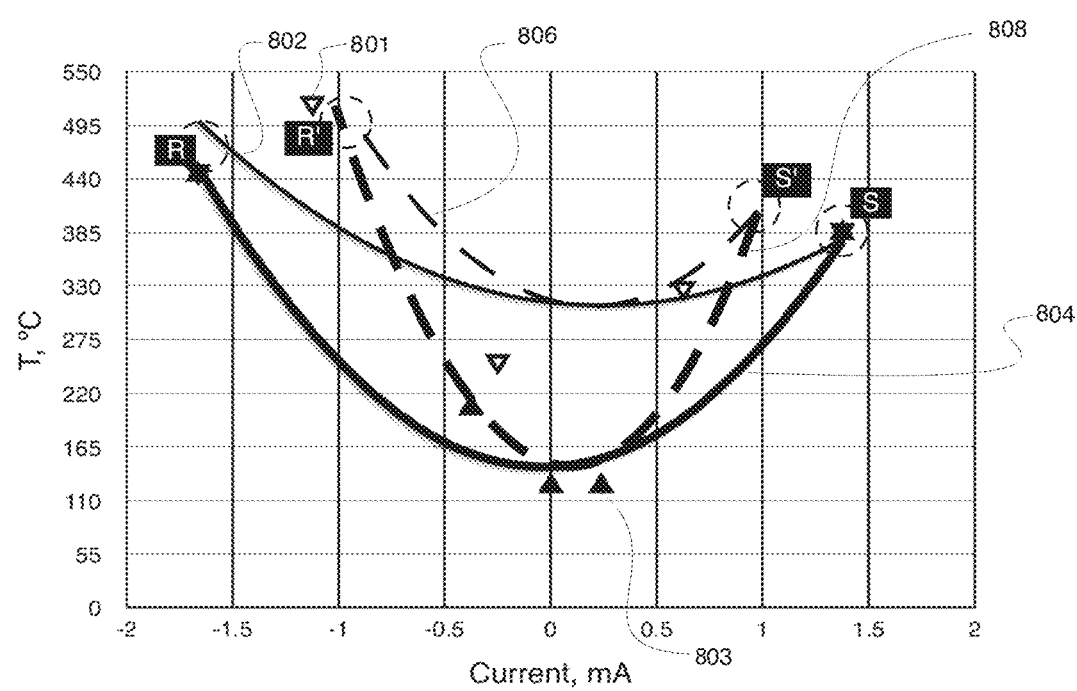
FIG. 8 is a graph of temperature vs. current in an example of a metal-oxide filamentary RS-NVM cell.

FIG. 8 is a graph of temperature vs. current in an example of a metal-oxide filamentary RS-NVM cell. This cell resets at a temperature near 500° C. and sets at a temperature near 385° C. The resistance change requiring the highest temperature will draw the most current. In some filamentary RS cells, resetting may draw a significantly higher current than setting. Resetting may also use heat assistance to a greater extent than setting in cases where electrically destroying part of a conductive path requires more power than electrically re-forming that part of the conductive path from readily accessible conductors.

Filament-forming for the first time in a newly fabricated cell may draw a current higher than either the set current or the reset current. However, filament-forming may only be done once, as part of manufacturing, rather than repeatedly as part of cell or array operation.

The triangles in FIG. 8 represent measured data for a cell without a heat-trapping layer; white triangles 801 for the LRS and black triangles 803 for the HRS. The solid-line curves are least-squares fits to the measured data; thinner line 802 for the LRS and thicker line 804 for the HRS. The reset conditions R are at the far left corner of the crescent formed by curves 802 and 804, and the set conditions S are at the far right corner. This cell drew a current of about 1.4 mA to set and about −1.7 mA to produce the Joule heating to assist the reset.

The dotted-line curves represent results of a predictive model simulating the same type of cell with a 10-nm-thick GST heat-trapping layer between the RS layer and the electrode; thinner line 806 for the LRS and thicker line 808 for the HRS. The predicted reset conditions R' are at the far left corner of the dotted-line crescent, and the predicted set conditions S are at the far right corner. The dotted-line curves have the same temperature range as the solid-line curves, but a narrower current range caused by heat being trapped for more efficient use. Assisted by the heat-trapping layer, the cell can reach the reset temperature with about −1 mA of current. According to calculations, chalcogenide heat-trapping layers may raise filament temperature by as much as 200° C. They may also reduce operating voltage, e.g., by 0.1-0.6V.

Embodiments of Heat-Trapping Layers

Figure 9A:
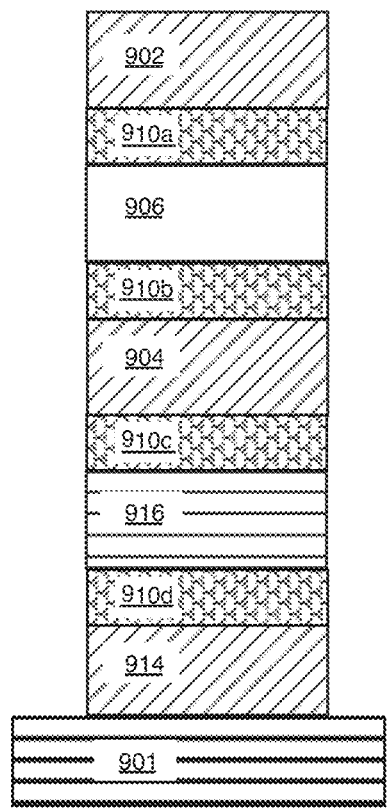
FIGS. 9A-9B are examples of RS film stacks with heat-trapping layers.
Figure 9B:
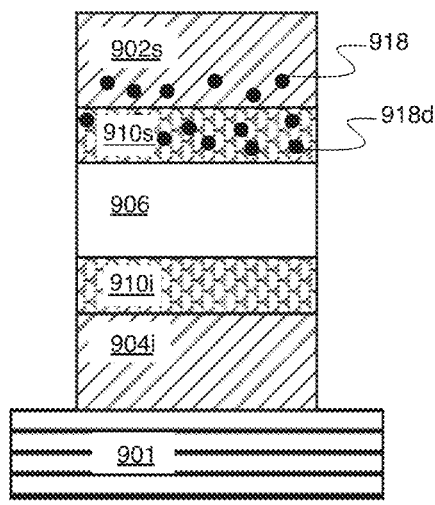

FIGS. 9A-9B are examples of RS film stacks with heat-trapping layers.

FIG. 9A represents an RS cell with a two-terminal selector. The film stack is formed on a substrate 901. Optionally, heat-trapping layers with high electrical conductivity and low thermal conductivity may be placed between any suitable electrode and a heat-assisted RS layer or selector in the stack. Heat-trapping layer 910a may be placed between top switch electrode 902 and resistance-switchable layer 906. Alternatively or additionally, heat-trapping layer 910b may be placed between resistance-switchable layer 906 and bottom switching electrode 904. Note that bottom switching electrode 904 doubles as a top selector electrode. In some embodiments, electrode 904 may be two electrodes in series, optionally with other layers or structures formed there between. Additionally or alternatively, heat-trapping layer 910c may be placed between top selector electrode 904 and thin-film selector 916. Additionally or alternatively, heat-trapping layer 910d may be placed between thin-film selector 916 and bottom selector electrode 914. In some embodiments, the heat-trapping layers are 2-20 nm thick.

When the conductors come from the resistance-switchable layer material (see FIG. 6B), both electrode 902 and electrode 904 may be inert, or chemical reactions are unneeded or unwanted between resistance-switchable layer 906 and electrode 902 or electrode 904. In some embodiments, resistance-switchable layer 906 may have a pair of heat-trapping layers 910a, 910b for heat confinement on both sides.

Some, though not all, thin-film selectors 916 require a high temperature to activate. Heat-trapping layer 910d between thin-film selector 916 and electrode 914 may reduce the current, voltage, or power consumed by the activation.

FIG. 9B illustrates an embodiment of an RS cell formed on a substrate 901 where the creation or motion of the conductors 918 that enable switching is preferably facilitated by direct contact between source electrode 902s and resistance-switchable layer 906 (see FIG. 6C). Conductors, or precursors to conductors 918, originate in source electrode 902s. Examples include filament-based cells using metal migration or valency change (see FIGS. 6D, 6E) as well as uniform interface-reaction cells (see FIGS. 6F, 6G).

In some embodiments, one electrode (e.g., top electrode 902s) may be a source, or reactive, electrode that actively contributes to the filament or reaction interface. The other electrode (e.g., bottom electrode 904i) may be inert, or otherwise may not provide an advantage by being in direct contact with resistance-switchable layer 906. In some embodiments with a first electrode that is intended to react with the resistance-switchable layer and a second electrode that is not, heat-trapping layer 910i may be formed between the inert, non-reacting electrode and the resistance-switchable layer.

Additional or alternative heat-trapping layer 910s (between RS layer 906 and electrode 902s) might, depending on the materials, tend to block conductors or precursors 918 from reacting with RS layer 906. To prevent such blocking and promote the desired reaction, heat-trapping layer 910s may have the conductors or precursors 918 added as a dopant 918d.

Figure 10:
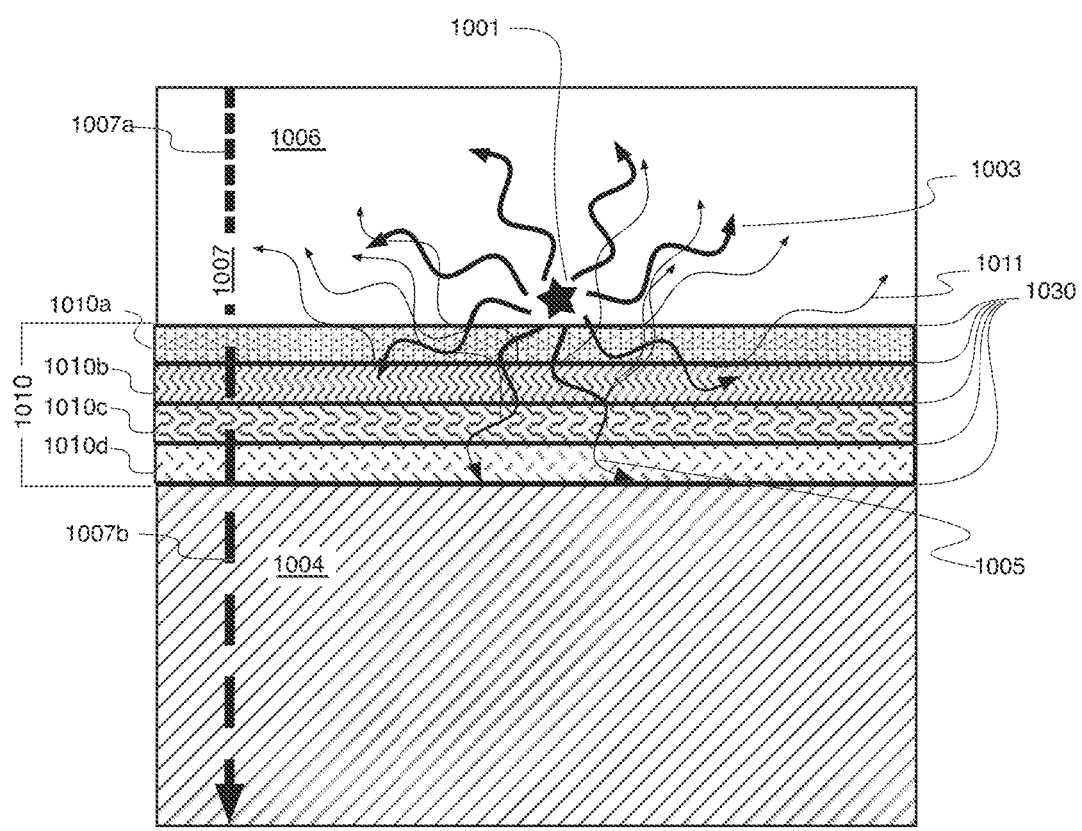
FIG. 10 illustrates a heat-trapping film stack using thermal boundary effects instead of, or in addition to, bulk material properties.

FIG. 10 illustrates a heat-trapping film stack using thermal boundary effects instead of, or in addition to, bulk material properties. Heat from theoretical heat source 1001 is partly prevented from leaking out through electrode 1004 by a stack 1010 of films 1010a-d producing thermal boundary effects. Thermal boundary effects depend on a mismatch in thermal impedance or phonon frequency between adjacent layers, rather than thickness-dependent bulk effects in thermally insulating material. Some absorption and re-emission may occur in heat-trapping stack 1010, similar to the bulk effect in FIG. 7B, but heat is also reflected by each of the thermal boundary surfaces 1030. Therefore, while some embodiments may include very thin layers, 1nm or less, of high-electrical-conductivity, low-thermal-conductivity materials such as the chalcogenides mentioned as candidates for single heat-trapping layers, some embodiments may use some stack materials that are electrically conductive but not highly thermally insulating, as long as the impedance mismatch at thermal boundary surfaces 1030 is pronounced enough to reflect portion 1011 of heat 1005 directed at the stack to combine with heat 1003 in RS layer 1006, attenuating the portion of heat 1005 that passes through to the electrode 1004.

Alternating layers of two or more materials with different thermal impedances may constitute heat-trapping stack 1010. Examples include GST and carbon, GST and titanium nitride (TiN), GST and titanium (Ti). The thermal impedances of some materials depend on the temperature at which the materials are deposited. In some embodiments, some or all the heat-trapping stack films 1010a-d have high electrical conductivity, as shown by the long, widely spaced dashes in line segment 1007b of conductivity arrow 1007 as it passes through heat-trapping stack 1010 (in contrast to the short, narrowly spaced dashes in line segment 1007a as it passes though the insulating material of RS layer 1006). In some embodiments, the total stack thickness may be 4-10 nm and the thickness of each layer in the stack may be as thin as 1-10 monolayers.

Briefly comparing FIG. 10 to FIGS. 9A-9B, any of the cells illustrated there, or their variations or equivalents, may substitute a heat-trapping stack like 1010 for the illustrated bulk heat-trapping layer(s) (any or all of heat-trapping layers 910a-d in FIG. 9A, or heat-trapping layer 910 in FIG. 9B. Calculations for alternating GST and carbon layers predicted a temperature increase on the order of ~90° C. inside the RS layer for each thermal boundary in the stack. Successive thermal boundaries have a cumulative effect; for instance, if 1 interface produces a 90° C. temperature increase, 2 interfaces will increase the temperature by about 150° C. Thermal boundary resistances for GST-C stack interfaces are about 27.5 $m^2*K/GW$; for GST-TiN, 5.2 $m^2K/GW$ for low temperature GST-Ti, 49.8 $m^2K/GW$; and for high temperature GST-Ti, 11.4 $m^2K/GW$. GST or other chalcogenides with aluminum (Al) is another possible combination for a heat-trapping stack.

Context of Embodiments Embedded in Computing Devices

Figure 11:
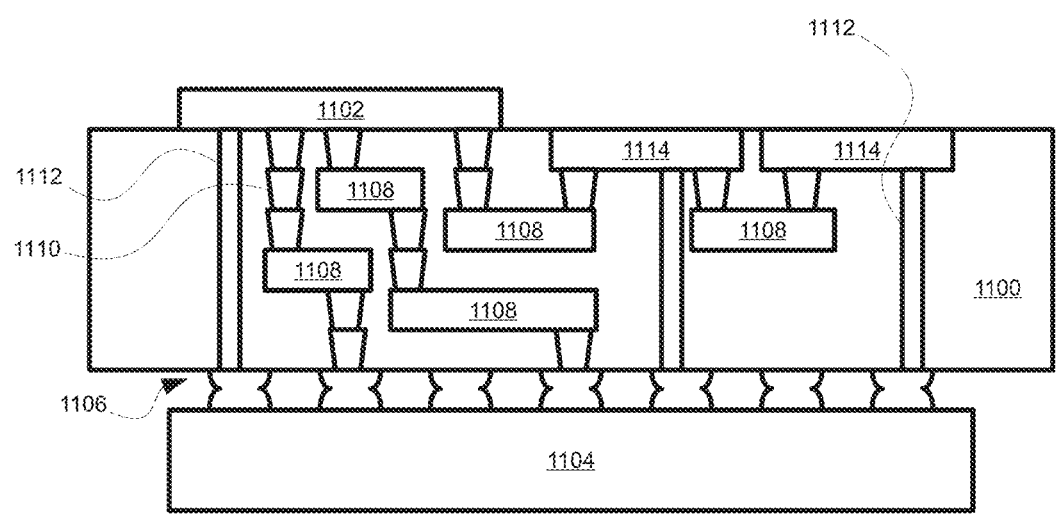
FIG. 11 illustrates an interposer that includes one or more embodiments of the invention.

FIG. 11 illustrates an interposer 1100 that includes one or more embodiments of the invention. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100.

In accordance with embodiments of the invention, apparatuses or processes disclosed herein may be used in the fabrication of interposer 1100.

Figure 12:
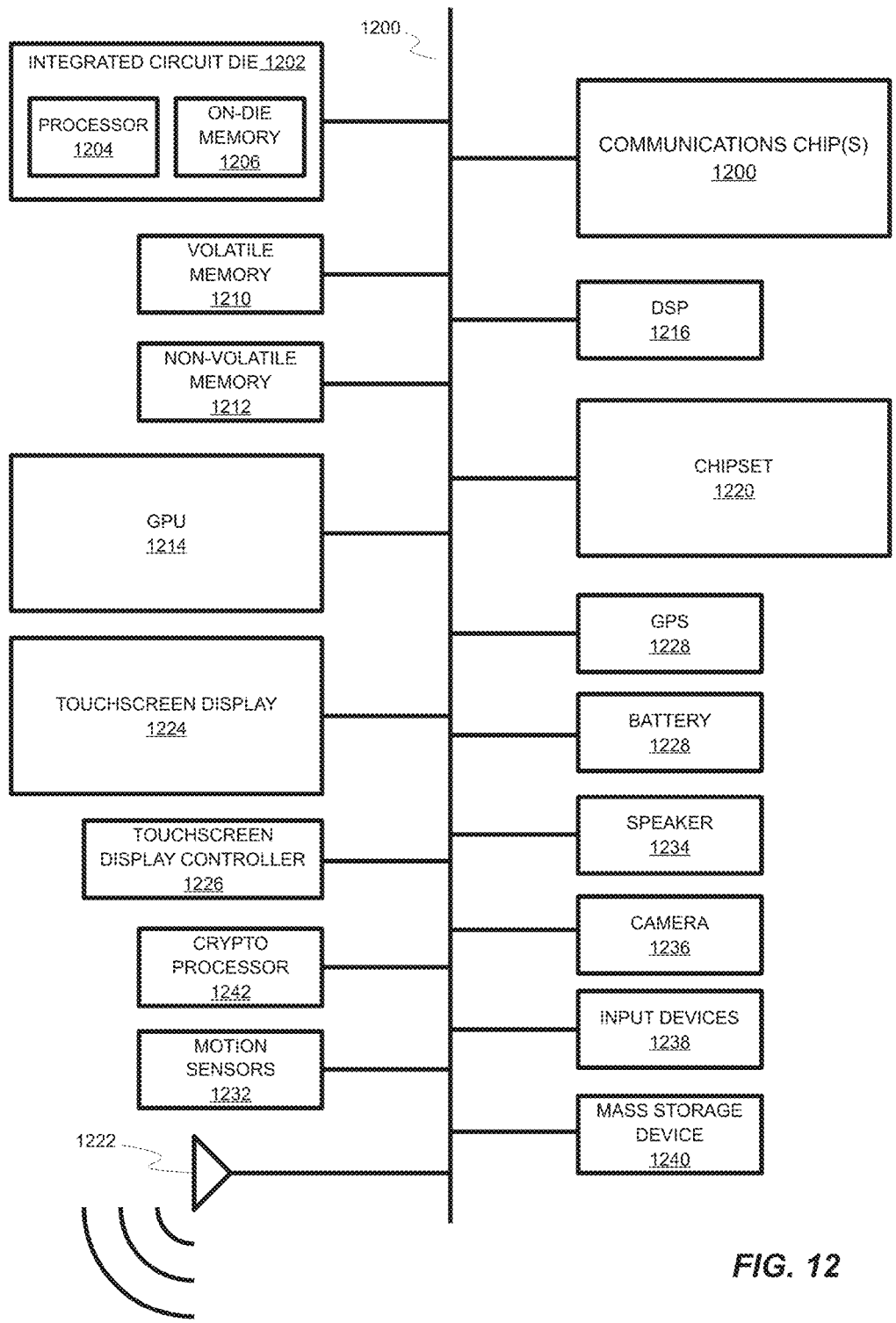
FIG. 12 is a block diagram of an example of a computing device which may include a number of components.

FIG. 12 is a block diagram of an example of a computing device. The computing device 1200 may include a number of components. In one embodiment, these components are attached to one or more motherboards. In an alternate embodiment, these components are fabricated onto a single system-on-a-chip (SoC) die rather than a motherboard. The components in the computing device 1200 include, but are not limited to, an integrated circuit die 1202 and at least one communication chip 1208. In some implementations the communication chip 1208 is fabricated as part of the integrated circuit die 1202. The integrated circuit die 1202 may include a CPU 1204 as well as on-die memory 1206, often used as cache memory, that can be provided by technologies such as embedded DRAM (eDRAM) or spin-transfer torque memory (STTM or STTM-RAM).

Computing device 1200 may include other components that may or may not be physically and electrically coupled to the motherboard or fabricated within a SoC die. These other components include, but are not limited to, volatile memory 1210 (e.g., DRAM), non-volatile memory 1212 (e.g., ROM or flash memory), a graphics processing unit 1214 (GPU), a digital signal processor 1216, a crypto processor 1242 (a specialized processor that executes cryptographic algorithms within hardware), a chipset 1220, an antenna 1222, a display or a touchscreen display 1224, a touchscreen controller 1226, a battery 1228 or other power source, a power amplifier (not shown), a global positioning system (GPS) device 1228, a compass 1230, a motion coprocessor or sensors 1232 (that may include an accelerometer, a gyroscope, and a compass), a speaker 1234, a camera 1236, user input devices 1238 (such as a keyboard, mouse, stylus, and touchpad), and a mass storage device 1240 (such as hard disk drive, compact disk (CD), digital versatile disk (DVD), and so forth).

The communications chip 1208 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1208 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips 1208. For instance, a first communication chip 1208 may be dedicated to shorter range wireless communications such as Wi-Fi and Bluetooth and a second communication chip 1208 may be dedicated to longer range wireless communications such as GPS, EDGE, GPRS, CDMA, WiMAX, LTE, Ev-DO, and others.

The processor 1204 of the computing device 1200 includes one or more devices, such as resistance-switching cells or arrays that are formed in accordance with embodiments of the invention. The term "processor" may refer to any device or portion of a device that processes electronic data from registers and/or memory to transform that electronic data into other electronic data that may be stored in registers and/or memory.

The communication chip 1208 may also include one or more devices, such as resistance-switching cells or arrays that are formed in accordance with embodiments of the invention.

In further embodiments, another component housed within the computing device 1200 may contain one or more devices, such as resistance-switching cells or arrays that are formed in accordance with implementations of the invention.

In various embodiments, the computing device 1200 may be a laptop computer, a netbook computer, a notebook computer, an Ultrabook computer, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

The preceding Description and accompanying Drawings describe examples of embodiments in some detail to aid understanding. However, the scope of protection may also include equivalents, permutations, and combinations that are not explicitly described herein. Only the claims appended here (along with those of parent, child, or divisional patents, if any) define the limits of the protected intellectual-property rights.

We claim:

1. A device, comprising:
    a substrate;
    a structure formed above the substrate to perform a function in response to an electrical signal;
    a first layer in the structure,
        wherein an electrical characteristic of the first layer changes in response to the electrical signal as part of the function; and
        wherein the change in the electrical characteristic is triggered, assisted, or enhanced by heating the first layer to a first temperature;
    a second layer in the structure, wherein the second layer is electrically and thermally conductive; and
    a stack of layers between the first layer and the second layer, wherein the at least one interface between a pair of stack layers produces a thermal boundary effect that reflects phonons back into the first layer.

2. The device of claim 1, wherein the third layer comprises one of a chalcogenide or a compound comprising a Group 6 element.

3. The device of claim 1, wherein the third layer has a thickness between 5 nm and 20 nm.

4. The device of claim 1, wherein a voltage drop in the third layer during the function is less than 100 mV.

5. The device of claim 1, wherein the electrical characteristic comprises impedance, and wherein the first layer's change in resistance comprises one of a valency change, a redox reaction, or an induced migration of metal atoms.

6. The device of claim 1, wherein the structure comprises a partially heat-activated selector; and
    wherein the function comprises actuating the selector.

7. The device of claim 1, wherein the function comprises switching.

8. The device of claim 1, wherein the structure comprises a resistance-switching cell;
wherein the first layer comprises a material having a switchable resistance;
wherein the second layer is to operate as a first electrode of the resistance-switching cell; and
wherein the third layer prevents a portion of heat in the first layer from flowing into the second layer.

9. The device of claim 8, wherein the second layer comprises an inert material.

10. The device of claim 8, wherein both of the second layer and the third layer comprise a reactive material.

11. The device of claim 8, wherein the first temperature is between 300 and 800° C.

12. The device of claim 8, wherein the resistance-switching cell is to operate as a nonvolatile memory element; and wherein the function comprises writing to the resistance-switching cell.

13. The device of claim 12, wherein the function comprises resetting the resistance-switching cell.

14. The device of claim 8, further comprising a fourth layer;
wherein the fourth layer is electrically and thermally conductive; and
wherein the fourth layer is to operate as a second electrode of the resistance-switching cell.

15. The device of claim 14, further comprising a fifth layer between the first layer and the fourth layer,
wherein the fifth layer is electrically conductive and thermally insulating; and
wherein the fourth layer comprises an inert material.

16. The device of claim 15, wherein the fifth layer comprises at least one of undoped germanium antimony telluride (GST) or GST doped with at least one of carbon, titanium, or titanium nitride.

17. The device of claim 14, wherein the fourth layer comprises a material that reacts with the first layer to form a conductive region in the first layer; and wherein the fourth layer is in contact with the first layer.

18. The device of claim 14, further comprising a resistive heater in contact with the first layer.

19. The device of claim 14, wherein the fourth layer comprises at least one of hafnium nitride, titanium nitride, tantalum nitride, zirconium nitride, aluminum nitride, lanthanum nitride, or silicon nitride.

20. The device of claim 14, wherein the fourth layer comprises at least one of silver or copper.

21. The device of claim 14, wherein the fourth layer comprises at least one of ruthenium, rhodium, palladium, iridium, or platinum.

22. The device of claim 1, wherein the first layer comprises at least one of nickel oxide, hafnium oxide, titanium oxide, tantalum oxide, zirconium oxide, aluminum oxide, lanthanum oxide, or silicon oxide.

23. The device of claim 1, wherein the first layer comprises at least one of amorphous silicon, germanium selenide or germanium telluride.

24. The device of claim 1, wherein the second layer comprises at least one of hafnium nitride, titanium nitride, tantalum nitride, zirconium nitride, aluminum nitride, lanthanum nitride, or silicon nitride.

25. The device of claim 1, wherein the second layer comprises at least one of silver or copper.

26. The device of claim 1, wherein the second layer comprises at least one of ruthenium, rhodium, palladium, iridium, or platinum.

27. The device of claim 1, wherein the third layer comprises at least one of undoped germanium antimony telluride (GST) or GST doped with at least one of carbon, titanium, or titanium nitride.

28. A device, comprising:
a substrate;
a structure formed above the substrate to perform a function in response to an electrical signal;
a first layer in the structure,
wherein an electrical characteristic of the first layer changes in response to the electrical signal as part of the function; and
wherein the change in the electrical characteristic is triggered, assisted, or enhanced by heating the first layer;
a second layer in the structure, wherein the second layer is electrically and thermally conductive; and
a stack of layers between the first layer and the second layer,
wherein at least one interface between a pair of stack layers produces a thermal boundary effect that reflects phonons back into the first layer.

29. The device of claim 28, wherein the stack of layers comprises a layer having a thickness between 1 and 5 monolayers.

30. The device of claim 28, wherein the stack of layers comprises at least one layer of chalcogenide and at least one layer of non-metal, transition metal, or metal nitride.

31. The device of claim 28, wherein the stack of layers comprises at least one layer of chalcogenide and at least one layer of carbon, titanium, or titanium nitride.

32. The device of claim 28, wherein the first layer comprises at least one of nickel oxide, hafnium oxide, titanium oxide, tantalum oxide, zirconium oxide, aluminum oxide, lanthanum oxide, or silicon oxide.

33. The device of claim 28, wherein the first layer comprises at least one of amorphous silicon, germanium selenide or germanium telluride.

34. The device of claim 28, wherein the second layer comprises at least one of hafnium nitride, titanium nitride, tantalum nitride, zirconium nitride, aluminum nitride, lanthanum nitride, or silicon nitride.

35. The device of claim 28, wherein the second layer comprises at least one of silver or copper.

36. The device of claim 28, wherein the second layer comprises at least one of ruthenium, rhodium, palladium, iridium, or platinum.

37. A system, comprising:
a first process logic array; and
a first nonvolatile resistance-switching memory array coupled to the process logic array and
comprising a plurality of cells; and
a stack to confine heat in a resistance-switchable layer of each of the cells by at least one of thermal insulation or thermal boundary effect.

38. The system of claim 37, wherein the first process logic array is formed on a first chip and the first nonvolatile resistance-switching memory array is formed on a second chip.

39. The system of claim 37, wherein the first process logic array and the first nonvolatile resistance-switching memory array are both formed on a single chip.

40. The system of claim 39, further comprising a second nonvolatile resistance-switching memory array formed on the single chip and coupled to the first process logic array.

41. The system of claim 39, further comprising:
- a second process logic array formed on the single chip; and
- a second nonvolatile resistance-switching memory array formed on the single chip;
- wherein the second nonvolatile resistance-switching memory array is coupled to the second process logic array.

42. The system of claim 37, wherein the first nonvolatile resistance-switching memory array requires less current to set or reset the cells than a comparable array;
- wherein the comparable array lacks the at least one electrically conductive layer or stack to confine heat, but is otherwise identical to the first nonvolatile resistance-switching memory array.

43. The system of claim 37, wherein the first nonvolatile resistance-switching memory array dissipates less heat to surrounding materials or structures than a comparable array;
- wherein the comparable array lacks the at least one electrically conductive layer or stack to confine heat, but is otherwise identical to the first nonvolatile resistance-switching memory array.

* * * * *